United States Patent
Basker et al.

(10) Patent No.: US 10,593,679 B2
(45) Date of Patent: Mar. 17, 2020

(54) STATIC RANDOM ACCESS MEMORY (SRAM) DENSITY SCALING BY USING MIDDLE OF LINE (MOL) FLOW

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Sivananda K. Kanakasabapathy, Niskayuna, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 15/790,381

(22) Filed: Oct. 23, 2017

(65) Prior Publication Data

US 2018/0114792 A1    Apr. 26, 2018

Related U.S. Application Data

(63) Continuation of application No. 15/332,266, filed on Oct. 24, 2016, now Pat. No. 9,881,926.

(51) Int. Cl.
*H01L 27/11* (2006.01)
*H01L 29/45* (2006.01)
(Continued)

(52) U.S. Cl.
CPC .... *H01L 27/1104* (2013.01); *H01L 21/02167* (2013.01); *H01L 21/32133* (2013.01);
(Continued)

(58) Field of Classification Search
CPC .......... H01L 29/0653; H01L 29/41783; H01L 29/45; H01L 29/665; H01L 27/0207;
(Continued)

(56) References Cited

U.S. PATENT DOCUMENTS

| | | | |
|---|---|---|---|
| 7,189,627 B2 | 3/2007 | Wu et al. | |
| 8,089,801 B2 | 1/2012 | Wang et al. | |

(Continued)

FOREIGN PATENT DOCUMENTS

EP    0766301 A1    4/1997

OTHER PUBLICATIONS

List of IBM Patents or Patent Applications Treated as Related dated Oct. 23, 2017, 2 pages.

(Continued)

*Primary Examiner* — Nilufa Rahim
(74) *Attorney, Agent, or Firm* — Tutunjian & Bitetto, P.C.; Kevin Michael Jordan

(57) ABSTRACT

A method is presented for forming a semiconductor structure. The method includes forming gate contacts on a semiconductor substrate, forming trench silicide (TS) contacts on the semiconductor substrate, recessing the TS contacts to form a gap region, filling the gap region of the recessed TS contacts with a dielectric, selectively etching the gate contacts to form a first conducting layer, and selectively etching the TS contacts to form a second conducting layer.

18 Claims, 9 Drawing Sheets

(51) Int. Cl.
*H01L 21/3213* (2006.01)
*H01L 21/02* (2006.01)
*H01L 21/768* (2006.01)
*H01L 21/8234* (2006.01)
*H01L 29/66* (2006.01)
*H01L 29/417* (2006.01)
*H01L 29/06* (2006.01)
*H01L 27/02* (2006.01)

(52) U.S. Cl.
CPC .. *H01L 21/76895* (2013.01); *H01L 21/76897* (2013.01); *H01L 21/823437* (2013.01); *H01L 21/823475* (2013.01); *H01L 29/0653* (2013.01); *H01L 29/41783* (2013.01); *H01L 29/45* (2013.01); *H01L 29/665* (2013.01); *H01L 27/0207* (2013.01)

(58) Field of Classification Search
CPC ......... H01L 21/76895; H01L 21/76897; H01L 21/02167; H01L 21/823475; H01L 21/32133
See application file for complete search history.

(56) References Cited

U.S. PATENT DOCUMENTS

| | | | |
|---|---|---|---|
| 9,275,889 B2 | 3/2016 | Kim et al. | |
| 9,293,466 B2 | 3/2016 | Liaw | |
| 2012/0104471 A1* | 5/2012 | Chang | H01L 21/76838 257/288 |
| 2014/0077305 A1* | 3/2014 | Pethe | H01L 21/76895 257/368 |
| 2015/0076609 A1* | 3/2015 | Xie | H01L 29/785 257/365 |
| 2015/0325514 A1 | 11/2015 | Mojumder et al. | |
| 2016/0133623 A1* | 5/2016 | Xie | H01L 27/088 257/384 |
| 2017/0162581 A1* | 6/2017 | Lai | H01L 21/02164 |

OTHER PUBLICATIONS

Chen, et al., "Investigation of Emerging Middle-of-Line Poly Gate-to-Diffusion Contact Reliability Issues", IEEE International Reliability Physics Symposium (IRDS). Held Apr. 15-19, 2012. pp. 4.1-4.9.

* cited by examiner

STATIC RANDOM ACCESS MEMORY (SRAM) DENSITY SCALING BY USING MIDDLE OF LINE (MOL) FLOW

BACKGROUND

Technical Field

The present invention relates generally to semiconductor devices, and more specifically, to SRAM density scaling by using middle of line (MOL) flow.

Description of the Related Art

Since the development of integrated circuits, the potential for reduced signal propagation time and increased functionality of individual chips, as well as manufacturing economy, has driven development of increases in integration density and scaling of individual circuit elements therein to smaller sizes. This incentive for scaling is particularly strong for memory devices, which have approximately quadrupled in capacity every three years.

Semiconductor memory devices include, for example, a static random access memory (SRAM) and a dynamic random access memory (DRAM). A DRAM memory cell generally includes one transistor and one capacitor, thereby providing a high degree of integration. DRAM, however, requires constant refreshing, which limits the use of DRAM to computer main memory. An SRAM memory cell, by contrast, is bi-stable, meaning that it can maintain its state statically and indefinitely, so long as adequate power is supplied. SRAM also supports high speed operation, with lower power dissipation, which is useful for computer cache memory.

SUMMARY

In accordance with an embodiment, a method is provided for performing static random access memory (SRAM) density scaling. The method includes forming gate contacts on a semiconductor substrate, forming trench silicide (TS) contacts on the semiconductor substrate, recessing the TS contacts to form a gap region, filling the gap region of the recessed TS contacts with a dielectric, selectively etching the gate contacts to form a first conducting layer, and selectively etching the TS contacts to form a second conducting layer.

In accordance with another embodiment, a semiconductor device is provided. The semiconductor device includes gate contacts formed on a semiconductor substrate and trench silicide (TS) contacts formed on the semiconductor substrate, the TS contacts recessed to form a gap region. The gap region of the recessed TS contacts is filled with a dielectric, the gate contacts are selectively etched to form a first conducting layer, and the TS contacts are selectively etched to form a second conducting layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
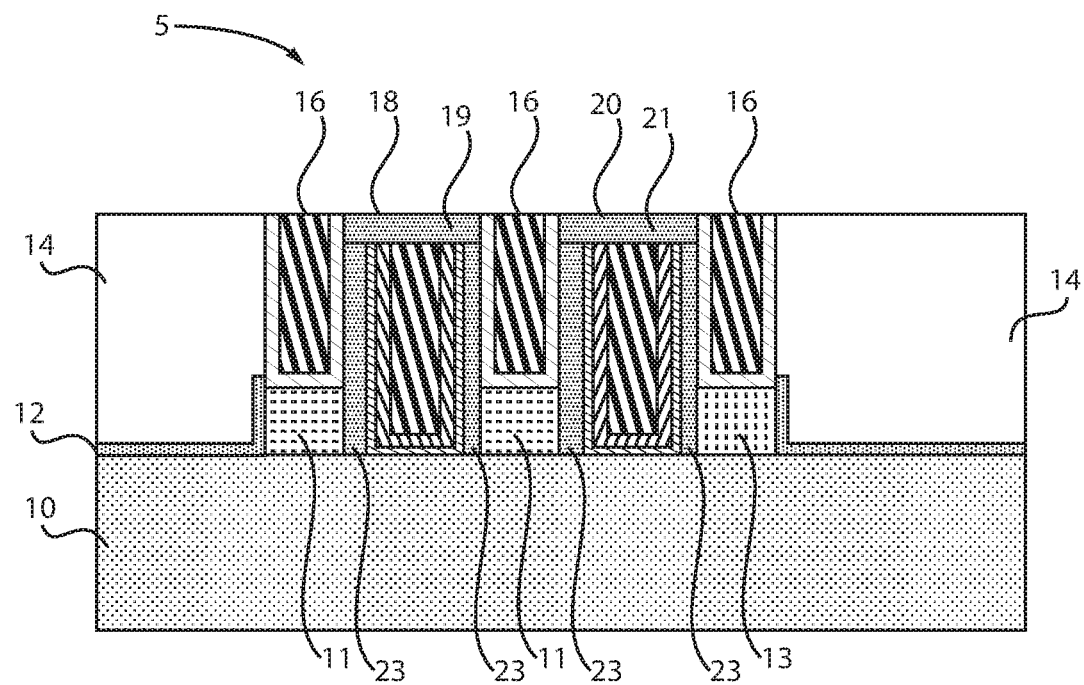
FIG. 1 is a cross-sectional view of a semiconductor structure including gate contacts and trench silicide (TS) contacts, in accordance with an embodiment of the present invention.

Embodiments of the present invention relate generally to a method for performing static random access memory (SRAM) density scaling. The method includes forming gate contacts on a semiconductor substrate, forming trench silicide (TS) contacts on the semiconductor substrate, recessing the TS contacts to form a gap region, filling the gap region of the recessed TS contacts with a dielectric, selectively etching the gate contacts to form a first conducting layer, and selectively etching the TS contacts to form a second conducting layer.

In one or more embodiments, the middle of line (MOL) flow is modified in order to get aggressive CB-to-CA (ohmic contact to self-aligned contact) scaling by using selective dielectrics. Since trench silicide (TS) level is used in MOL, the TS is recessed and filled with a dielectric (such as SiC/SiCN) that can protect TS during CB (gate contact) formation. Once the CB is formed, the CAs are used to etch the high-k selectively to nitride to contact TS, as well as to form cross-couples.

In one or more embodiments, the CB to TS can be pushed further than 34 nm and the high-k layer prevents any CB-to-TS shorts. A s a result, the cross-couple is prevented by the presence of the high-k layer.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention relates to metal semiconductor alloy contacts. A "metal semiconductor alloy" is an alloy of a metal and semiconductor. An alloy is homogeneous mixture or solid solution, in which the atoms of the metal are replacing or occupying interstitial positions between the atoms of the semiconductor.

The metal semiconductor alloy contacts can be formed to semiconductor devices, such as field effect transistors (FETS). A field effect transistor (FET) is a semiconductor device in which output current, i.e., source-drain current, is controlled by the voltage applied to a gate structure. A field effect transistor (FET) has three terminals, i.e., a gate structure, a source and a drain region. The gate structure is a structure used to control output current, i.e., flow of carriers in the channel portion, of a semiconducting device, such as a field effect transistor (FET), through electrical or magnetic fields. The channel portion of the substrate is the region between the source region and the drain region of a semiconductor device that becomes conductive when the semiconductor device is turned on. The source region is a doped region in the semiconductor device, in which majority carriers are flowing into the channel portion. The drain region is the doped region in semiconductor device located at the end of the channel portion, in which carriers are flowing out of the semiconductor device through the drain region.

When forming semiconductor devices, such as field effect transistors, using replacement gate methods, the metal semiconductor alloy contacts to the source and drain regions of the semiconductor device are typically formed in a trench, i.e., via opening, that extends through a dielectric layer. The dielectric layer also provides the opening to the channel portion of the semiconductor substrate that contains the functioning gate structure, once the sacrificial gate has been removed. It has been determined that forming metal semiconductor alloy contacts on the upper surface of the source region and the drain region that is defined by the trench opening results in increased resistance of the contact to the channel portion of the substrate. More specifically, in comparison to metal semiconductor alloy contacts that are not confined within the trench, and extend along an entire upper surface of the source and drain regions substantially to the sidewall of the gate structure, metal semiconductor alloy contacts that are contained within trenches increase the resistance of the contact. The metal semiconductor alloy contacts that are contained within trenches have an increased resistance, because a semiconductor region that is free of higher conductivity metal is present between the metal semiconductor alloy contact that is contained within the trench and the channel portion of the semiconductor device.

FIG. 1 is a cross-sectional view of a semiconductor structure including gate contacts and trench silicide (TS) contacts, in accordance with an embodiment of the present invention.

During front end-of-the-line processing, a plurality of semiconductor devices (e.g., transistors, resistors, capacitors, and the like) are formed on a semiconductor wafer. The semiconductor devices are then locally interconnected during middle-of-the-line (MEOL) processing to produce an integrated circuit, such as a logic circuit or a memory cell. To enable the local interconnection of the semiconductor devices during MEOL processing, device-level plugs are formed in ohmic contact with the electrically-active areas of the substrate (commonly designated as "RX") and the gate conductors (commonly designated as "PC"), and local interconnect lines are formed in ohmic contact with the device-level plugs. In many cases, such as in certain replacement gate-based processes, the local interconnect lines and device-level plugs can be divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts." The local contacts can also include shared TS/CB contacts, which provide an electrically-bridged connection to both RX and PC. After formation of the local contacts, the fabrication process advances to back end-of-the-line (BEOL) processing during which additional BEOL layers are formed to globally interconnect the integrated circuits, which are subsequently separated into individual die during wafer dicing.

From one circuit generation or node to the next, critical dimensions are continually reduced and pattern densities are continually increased. To enable the production of highly dense circuit layouts, MEOL patterning processes have been developed wherein multiple masks are utilized to pattern the dielectric layers deposited over the semiconductor devices (e.g., the pre-metal dielectric layer and the overlying inter-metal dielectric layer), which are subsequently filled with metal and polished to produce the local contacts. The CA contacts can thus be printed with a first mask and a first illumination source, while the CB contacts are printed with a second mask and a second illumination source. To achieve an extremely fine resolution, the CA contacts can be printed to have a unidirectional orientation; that is, the CA contacts can be printed as small trench-like structures, which are elongated along the maximum axis of the circuit layout, but extremely narrow along the minimum axis. The CB contacts, however, are typically not so constrained and can be printed to have a bidirectional orientation; that is, the CB contacts can extend along both the maximum and minimum axes of the circuit layout.

In densely-patterned circuits, such as SRAM cells included within semiconductor nodes equal to or less than 20 nm, geometry-driven design rules can exclude the usage of copper in the metallization of contact levels containing non-unidirectional local contacts. In the case of conventionally-produced circuits, the bidirectional CB contacts typically extend downward through the local interconnect level in which the CA contacts are formed and into an upper portion of the device-contact level in which the TS contacts are formed.

Referring back to FIG. 1, a semiconductor structure 5 includes a semiconductor substrate 10. A gate insulation layer 12 is formed over portions of the substrate 10. TS contacts 16 are formed adjacent gate contacts or structures 18, 20. Gate structure 18 includes a gate cap 19 and sidewall spacers 23, whereas gate structure 20 includes a gate cap 21 and sidewall spacers 23. Sidewall spacers 23 are formed adjacent or on opposed ends of the gate contacts 18, 20. In the example embodiment, three TS contacts 16 are shown and two gate contacts 18, 20 are shown. Of course, one skilled in the art may contemplate a plurality of TS contacts and gate contacts formed over the semiconductor substrate 10. A dielectric 14 is deposited adjacent two of the TS contacts 16. The dielectric 14 can be, e.g., an interlevel dielectric (ILD).

Moreover, the TS contacts 16 are formed adjacent the source/drain regions 11, 13. Forming the source and drain regions 11, 13 can include forming an in situ doped epitaxial semiconductor material adjacent the TS contacts 16. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a [100] crystal surface will take on a [100] orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 11, 13 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 11, 13.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from about 550° C. to about 900° C. Although higher temperature typically results in faster deposition, the faster deposition can result in crystal defects and film cracking.

The epitaxial semiconductor material that provides the source and drain regions 11, 13 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions 11, 13 can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10 including high-k oxides and/or nitrides. In one or more embodiments, the substrate 10 can be a silicon wafer. In an embodiment, the substrate 10 is a single crystal silicon wafer.

The gate insulation layer 12 can be comprised of a variety of different materials, such as, for example, silicon dioxide, a so-called high-k (k greater than 10) insulation material (where k is the relative dielectric constant), etc. Non-limiting examples of suitable materials for the high-k dielectric material include oxides, nitrides, oxynitrides, silicates (e.g., metal silicates), aluminates, titanates, nitrides, or any combination thereof.

In various embodiments, the high-k material can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide(e.g., BaTiO$_3$), strontium titanium oxide(e.g., SrTiO$_3$), yttrium oxide (e.g., Y$_2$O$_3$), aluminum oxide (e.g., Al$_2$O$_3$), lead scandium tantalum oxide (Pb(Sc$_x$Ta$_{1-x}$)O$_3$), and lead zinc niobate (e.g., PbZn$_{1/3}$ Nb$_{2/3}$ O$_3$). The high-k material can further include dopants such as lanthanum and/or aluminum. The stoichiometry of the high-K compounds can vary.

In various embodiments, the high-k material can have a thickness in the range of about 1 nm to about 3 nm.

The high-k dielectric material layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material can vary depending on the deposition process as well as the composition and number of high-k dielectric materials used.

In some embodiments, the ILD 14 is planarized. The ILD 14 can extend to a top surface of the TS contacts 16. The height of the ILD 14 is approximately equal to the height of the gate contacts 18, 20.

In various embodiments, the height of the ILD 14 can be reduced by chemical-mechanical polishing (CMP) and/or etching. Therefore, the planarization process can be provided by CMP. Other planarization process can include grinding and polishing.

In one or more embodiments, the ILD 14 can have a thickness in the range of about 3 nm to about 10 nm, or in the range of about 3 nm to about 5 nm.

The ILD 14 can be selected from the group consisting of silicon containing materials such as SiO$_2$, Si$_3$N$_4$, SiO$_x$N$_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 14 include any of the aforementioned materials in porous form, or in a form that changes during processing to or from being porous and/or permeable to being non-porous and/or non-permeable.

In one or more embodiments, the gate contacts or structure 18, 20 can be of a material such as polysilicon or amorphous silicon, or the gate contacts 18, 20 can be comprised of one or more metal layers that act as the gate electrode. As will be recognized by those skilled in the art, the gate structures 18, 20 of the transistor devices depicted in the drawings, i.e., are intended to be representative in nature. That is, the gate structures 18, 20 can be comprised of a variety of different materials and can have a variety of configurations, and the gate structures 18, 20 can be made using either the so-called "gate-first" or "replacement gate" techniques.

The spacers 23 can be formed by deposition followed by a directional etch (e.g., RIE). Spacers 23 can be formed along the sidewalls of the gate structures 18, 20. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 23. Spacer material can be silicon oxide, silicon oxynitride, silicon nitride, SiBCN, SiOCN, SiOC, or any suitable combination of those materials.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
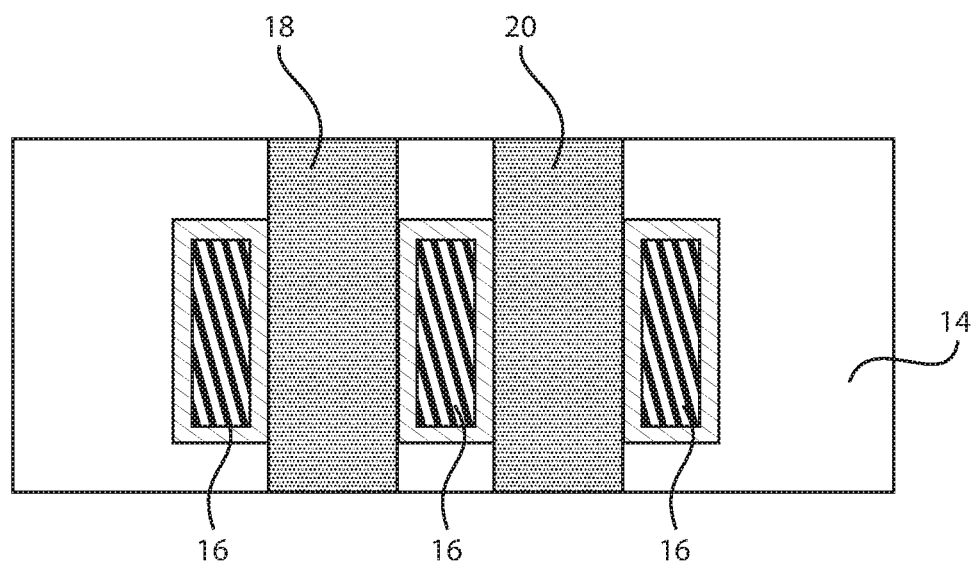
FIG. 2 is a top view of the semiconductor structure of FIG. 1 illustrating the top portion of the gate contacts and the TS contacts, in accordance with an embodiment of the present invention.

FIG. 2 is a top view of the semiconductor structure of FIG. 1 illustrating the top portion of the gate contacts and the TS contacts, in accordance with an embodiment of the present invention.

The top view illustrates the TS contacts 16 and the gate contacts 18, 20. The gate contacts 18, 20 are shown adjacent the TS contacts 16.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 3:
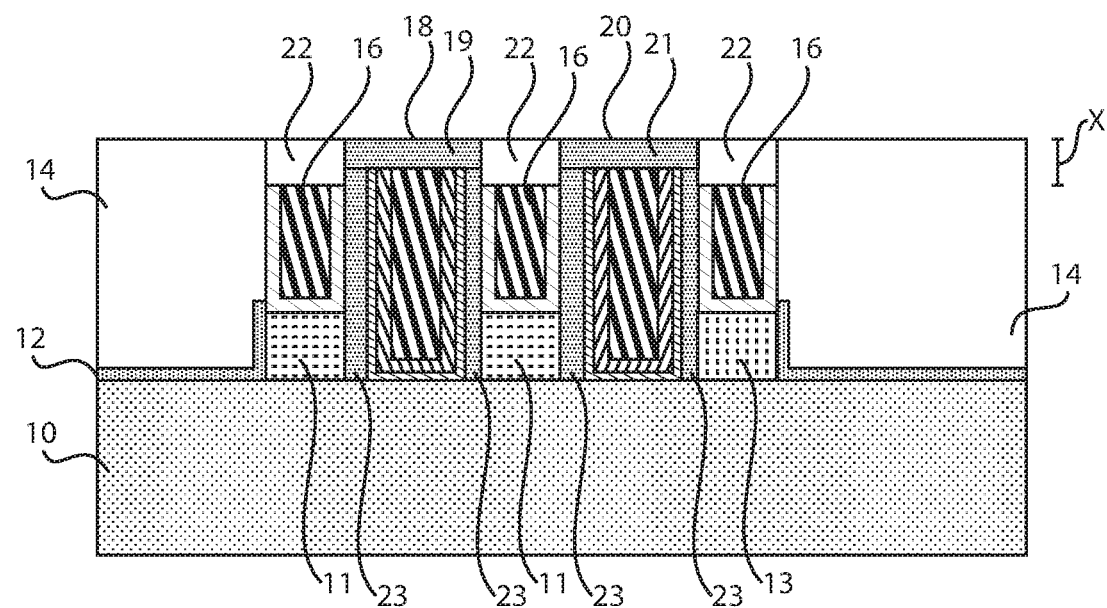
FIG. 3 is a cross-sectional view of a semiconductor structure of FIG. 1 where the TS contacts are recessed, in accordance with an embodiment of the present invention.

FIG. 3 is a cross-sectional view of a semiconductor structure of FIG. 1 where the TS contacts are recessed, in accordance with an embodiment of the present invention.

In various embodiments, the TS contacts 16 are recessed by a distance "X" to create recesses or gaps or cavities 22. The TS contacts 16 can be recessed by etching. The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process. In one example embodiment, RIE is performed.

In an example embodiment, a high density plasma CVD and etching process operation (hereinafter "HDP CVD-etching process") can be performed. In general, the HDP CVD-etching process is a combination of deposition/etch cycles. The HDP CVD-etching process typically involves performing a series of CVD deposition and etching processes in a common process chamber without breaking vacuum or transferring the wafer to another chamber, e.g., deposition-etch-deposition-etch, etc. The number and duration of the deposition-etch sequences performed in the HDP CVD-etching process may vary depending upon the particular application and may vary depending upon factors such as the depth and CD of the opening into which the material is to be deposited. The precise parameters of the HDP CVD-etching process for any particular application may need to be determined based upon experimentation and testing techniques that are within the skill level of those skilled in the art. In one embodiment, the HDP CVD-etching process involves use of $SiH_4$, $N_2/NH_3$ and Ar, where the argon has a sputtering type effect at the same time CVD film deposition is occurring. In one embodiment, during the etching portion of the HDP CVD-etching process, $NF_3$ is used as an etchant gas.

Figure 4:
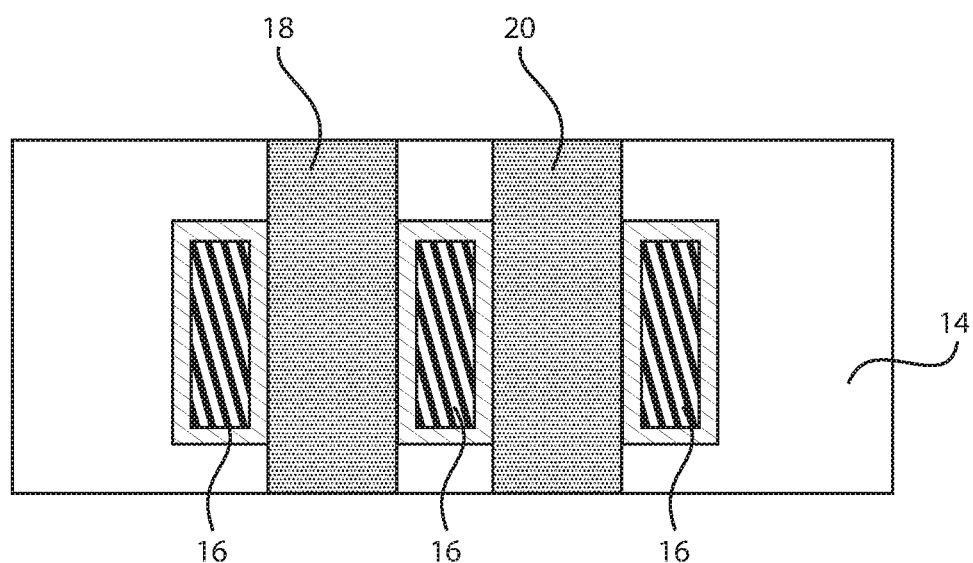
FIG. 4 is a top view of the semiconductor structure of FIG. 3 illustrating the top portion of the gate contacts and the TS contacts after recessing of the TS contacts is performed, in accordance with an embodiment of the present invention.

FIG. 4 is a top view of the semiconductor structure of FIG. 3 illustrating the top portion of the gate contacts and the TS contacts after recessing of the TS contacts is performed, in accordance with an embodiment of the present invention.

The top view illustrates the TS contacts 16 and the gate contacts 18, 20. The gate contacts 18, 20 are shown adjacent the TS contacts 16. FIG. 4 is exactly the same as FIG. 2. In other words, after recessing of the TS contacts 16, the top view remains the same.

Figure 5:
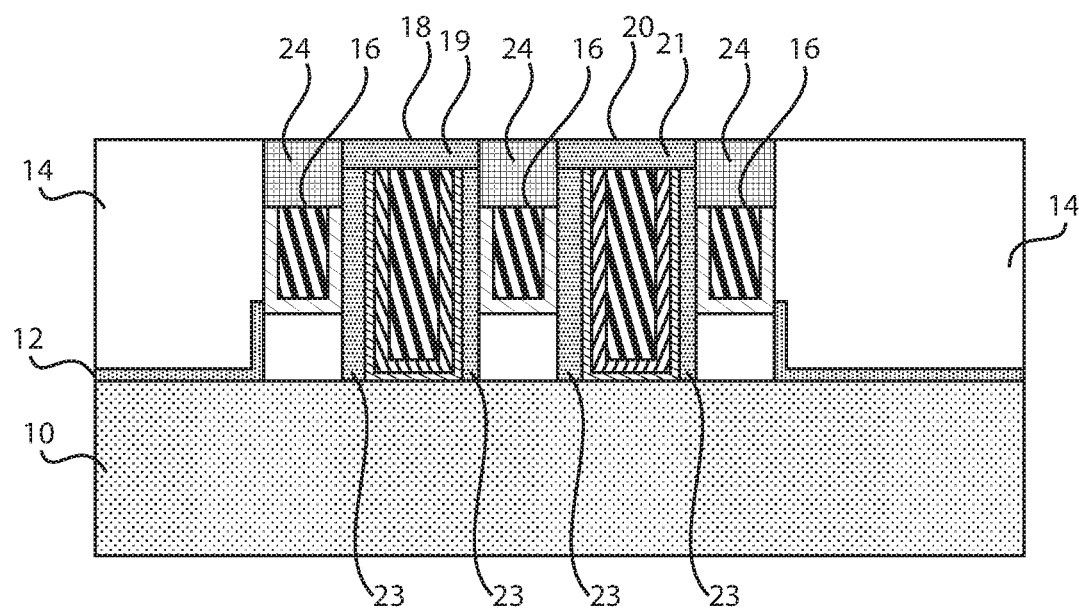
FIG. 5 is a cross-sectional view of a semiconductor structure of FIG. 3 where the recessed TS sections are filled with a dielectric, in accordance with an embodiment of the present invention.

FIG. 5 is a cross-sectional view of a semiconductor structure of FIG. 3 where the recessed TS sections are filled with a dielectric, in accordance with an embodiment of the present invention.

In various embodiments, the recesses or gaps or cavities 22 are filled with a dielectric 24. The dielectric 24 can be, e.g., silicon carbide (SiC). In another embodiment, the dielectric 24 can be, e.g., silicon carbide nitride (SiCN).

Figure 6:
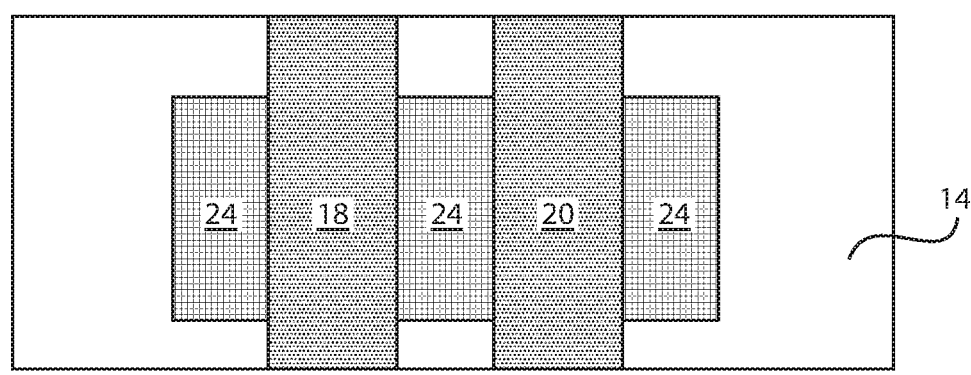
FIG. 6 is a top view of the semiconductor structure of FIG. 5 illustrating the top portion of the gate contacts and the TS contacts after the TS contacts are filled with the dielectric, in accordance with an embodiment of the present invention.

FIG. 6 is a top view of the semiconductor structure of FIG. 5 illustrating the top portion of the gate contacts and the TS contacts after the TS contacts are filled with the dielectric, in accordance with an embodiment of the present invention.

The top view illustrates the TS contacts 16 and the gate contacts 18, 20. The gate contacts 18, 20 are shown adjacent the TS contacts 16. The TS contacts 16 are shown filled with the dielectric 24.

Figure 7:
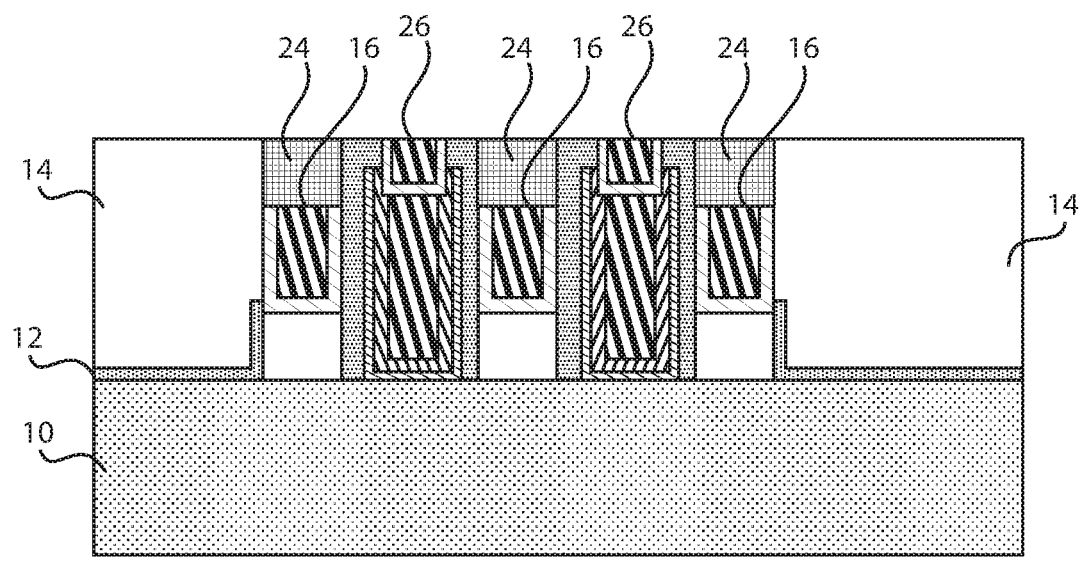
FIG. 7 is a cross-sectional view of a semiconductor structure of FIG. 5 where the gate contacts are metallized, in accordance with an embodiment of the present invention.

FIG. 7 is a cross-sectional view of a semiconductor structure of FIG. 5 where the gate contacts are metallized, in accordance with an embodiment of the present invention.

In various embodiments, the gate contacts 18, 20 are metallized by depositing metal layer 26. Metal layer 26 preferably comprises any metal suitable for effectively conducting electricity, including, but not limited to, copper, gold, nickel-titanium alloy and combinations comprising at least one of the foregoing metals. Metallization can be performed by any suitable metal deposition technique, including, but not limited to, sputtering, evaporating, electroplating, electroless plating and combinations comprising at least one of the foregoing metal deposition techniques.

By way of example only, blanket metallization techniques can be employed to apply metal layer 26. Specifically, metal layer 26 can be applied by blanket metallizing all exposed surfaces by electroplating to a sufficient thickness of, for example, copper. The electroplating is preferably followed by the application of a photoresist and the subsequent exposure of the photoresist, e.g., by light, through a photomask. The photoresist is developed, exposing the areas desired to be etched away.

Figure 8:
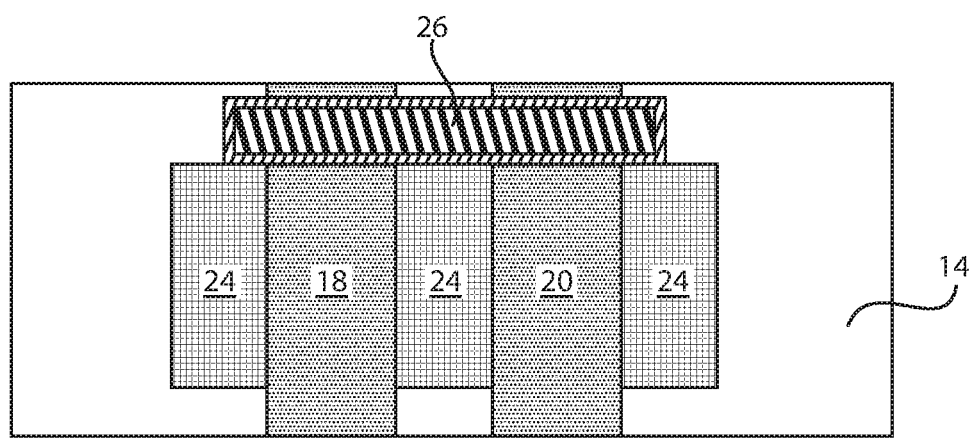
FIG. 8 is a top view of the semiconductor structure of FIG. 7 illustrating the top portion of the gate contacts and the TS contacts including the added metallization layer, in accordance with an embodiment of the present invention.

FIG. 8 is a top view of the semiconductor structure of FIG. 7 illustrating the top portion of the gate contacts and the TS contacts including the added metallization layer, in accordance with an embodiment of the present invention.

The top view illustrates the metal layer 26 extending along a portion the gate contacts 18, 20. The metal layer 26 is adjacent or in the vicinity of the TS contacts 16 filled with the dielectric 24.

Figure 9:
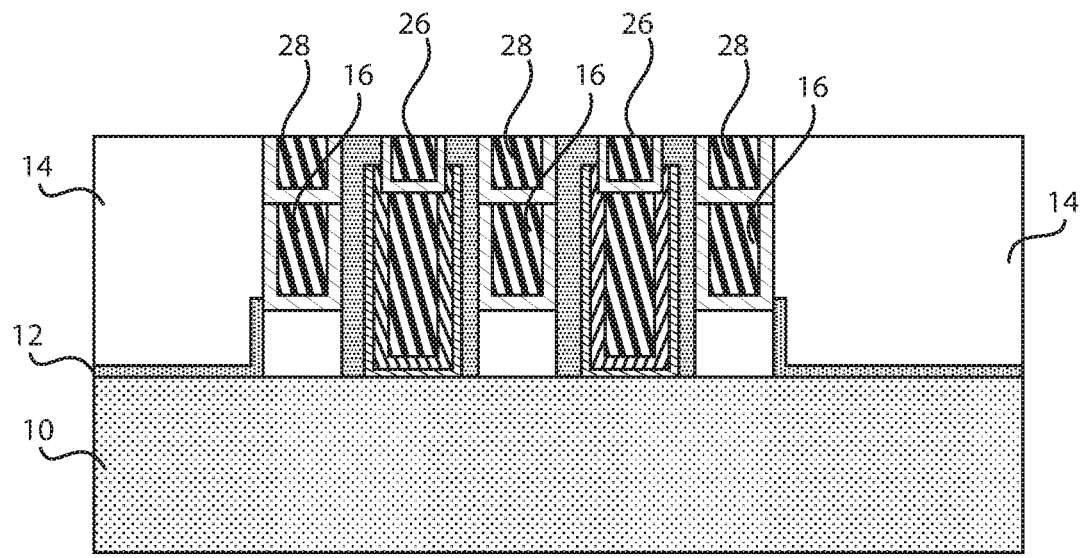
FIG. 9 is a cross-sectional view of a semiconductor structure of FIG. 7 where the TS contacts are metallized, in accordance with an embodiment of the present invention.

FIG. 9 is a cross-sectional view of a semiconductor structure of FIG. 7 where the TS contacts are metallized, in accordance with an embodiment of the present invention.

In various embodiments, the TS contacts 16 are metallized by depositing metal layer 28. Metal layer 28 preferably comprises any metal suitable for effectively conducting electricity, including, but not limited to, copper, gold, nickel-titanium alloy and combinations comprising at least one of the foregoing metals. Metallization can be performed by any suitable metal deposition technique, including, but not limited to, sputtering, evaporating, electroplating, electroless plating and combinations comprising at least one of the foregoing metal deposition techniques.

Figure 10:
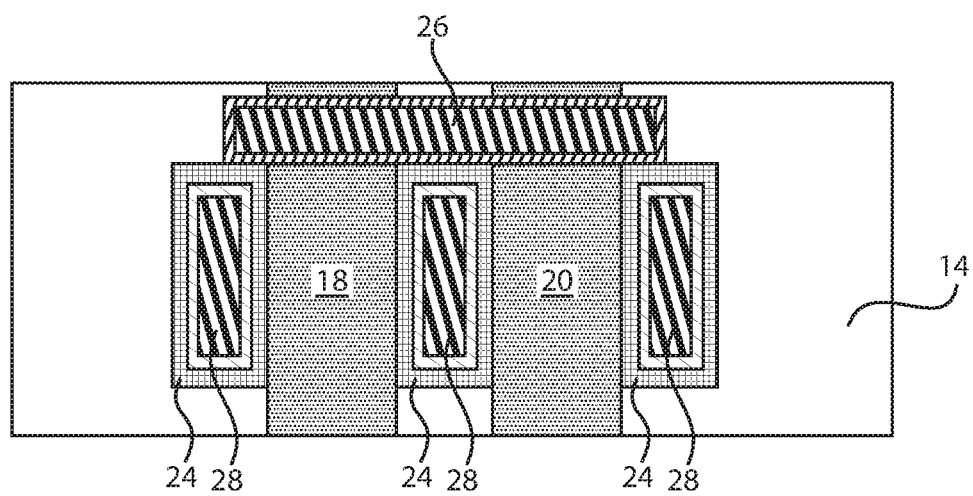
FIG. 10 is a top view of the semiconductor structure of FIG. 9 illustrating the top portion of the gate contacts and the TS contacts including the added metallization layers for both gate and TS contacts, in accordance with an embodiment of the present invention.

FIG. 10 is a top view of the semiconductor structure of FIG. 9 illustrating the top portion of the gate contacts and the TS contacts including the added metallization layers for both gate and TS contacts, in accordance with an embodiment of the present invention.

The top view illustrates the metal layer 28 extending along a portion of the dielectric layer 24 deposited over the TS contacts 16.

Figure 11:
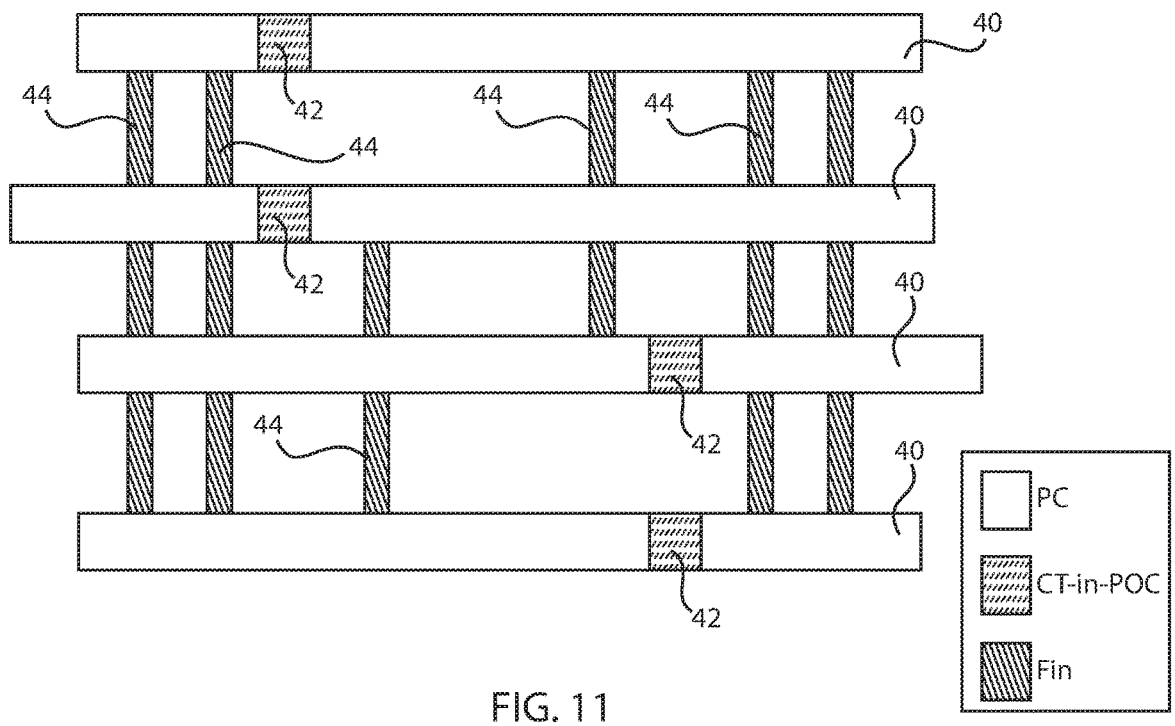
FIG. 11 is a top-down or layout view of the SRAM memory, in accordance with an embodiment of the present invention.

FIG. 11 is a top-down or layout view of the SRAM memory, in accordance with an embodiment of the present invention.

The layout view depicts a plurality of gate conductors 40 (PC). CT-in-POC 42 refers to an integration scheme for CT (gate cut). The conventional way for CT is right before or right after PC (gate) or integrated in PC (gate) patterning process. However, the CT-in-POC 42 scheme refers to moving the gate cut process step to the downstream module, which is poly open CMP. It is performed during post-spacer SD formation and pre-metal deposition steps. A plurality of fins 44 are also shown.

In older technologies, the CA and CB contacts were typically formed at the same time. However, as device dimensions and gate pitch dimensions decreased, the formation of self-aligned contacts has become necessary so as to avoid creating an electrical short between the CA contact and the gate structure. Typically, the gate structure is fully encapsulated by a silicon nitride cap layer and a silicon nitride sidewall spacer. A layer of insulating material, such as silicon dioxide, is formed on the substrate adjacent the gate structure and above the source/drain regions. To form the opening for the self-aligned source/drain contact structure (CA), an RIE process is typically performed to remove the silicon dioxide material selectively relative to the silicon nitride materials that encapsulate the gate structure. Since formation of the contact opening for the gate contact (CB) necessarily had to involve etching through the silicon nitride gate cap layer, the formation of the CA contacts and the CB contact could not be performed at the same time. That is, performing a common CA/CB etching process with an etchant that would remove portions of the silicon nitride gate cap layer (so as to form the CB contact opening) would consume the protective silicon nitride sidewall spacers and the silicon nitride gate cap layer adjacent the contact openings for the CA contacts, thereby exposing the gate structure to the CA contact openings.

Figure 12:
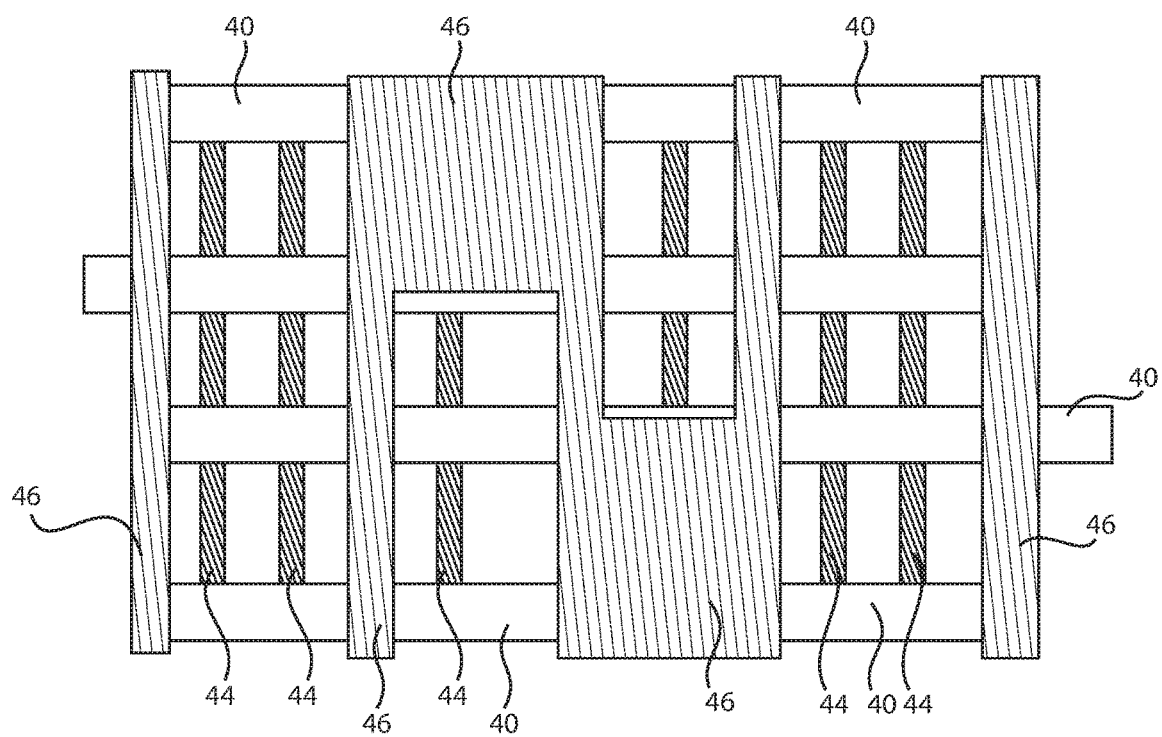
FIG. 12 is a layout view of the SRAM memory of FIG. 11 where TS masks are applied, in accordance with an embodiment of the present invention.

FIG. 12 is a layout view of the SRAM memory of FIG. 11 where TS masks are applied, in accordance with an embodiment of the present invention.

TS mask 46 is applied to the SRAM memory in order to etch the TS contacts.

Figure 13:
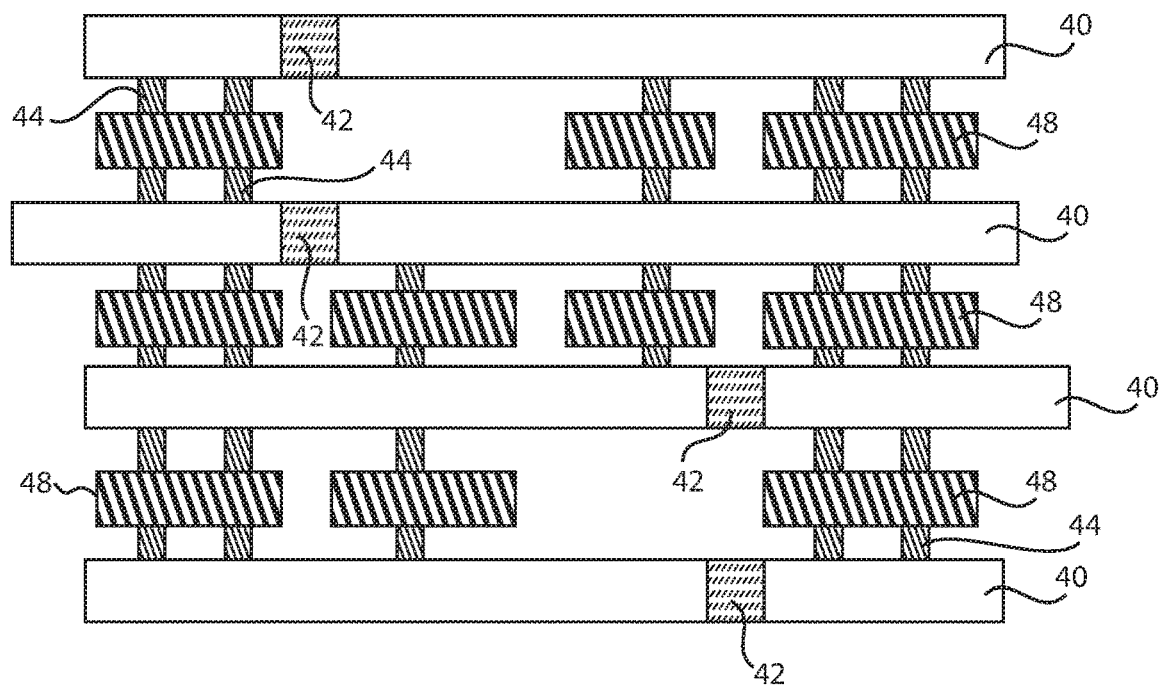
FIG. 13 is a layout view of the SRAM memory of FIG. 12 where TS metallization takes place, in accordance with an embodiment of the present invention.

FIG. 13 is a layout view of the SRAM memory of FIG. 12 where TS metallization takes place, in accordance with an embodiment of the present invention.

The TS contacts are metallized with a metal 48, e.g., Tungsten (W). Metallization can be performed by any suitable metal deposition technique, including, but not limited to, sputtering, evaporating, electroplating, electroless plating and combinations comprising at least one of the foregoing metal deposition techniques.

Figure 14:
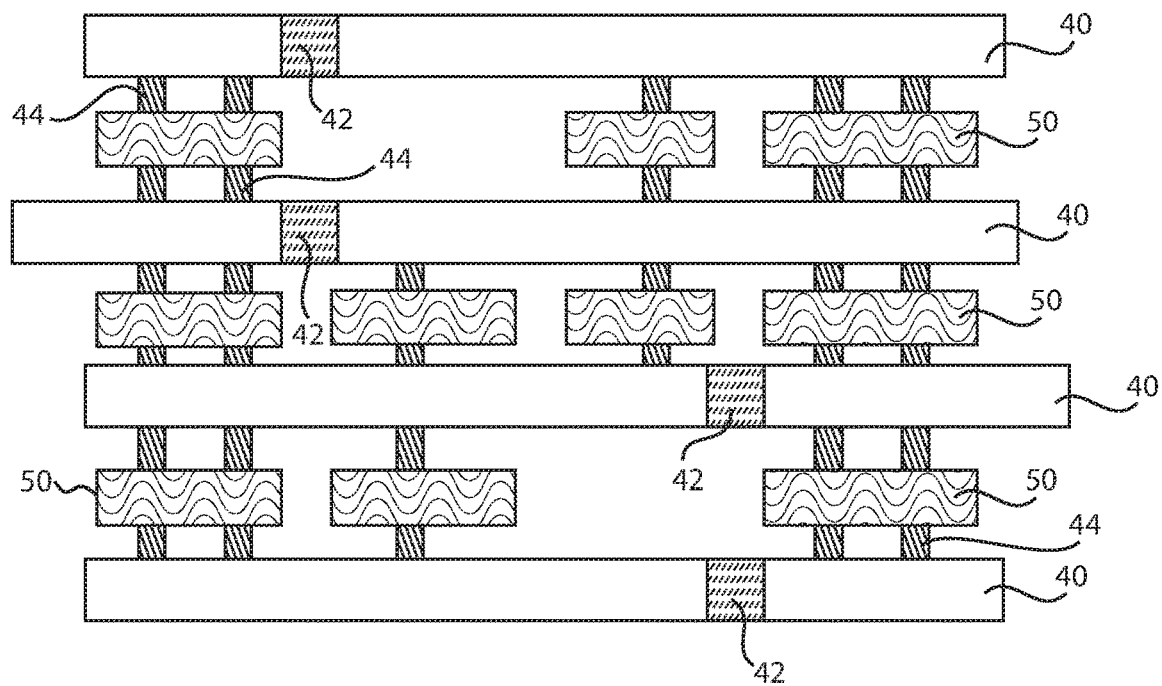
FIG. 14 is a layout view of the SRAM memory of FIG. 13 where TS contacts are recessed and filled with a dielectric, in accordance with an embodiment of the present invention.

FIG. 14 is a layout view of the SRAM memory of FIG. 13 where TS contacts are recessed and filled with a dielectric, in accordance with an embodiment of the present invention.

The TS contacts are recessed and filled with a dielectric 50. The dielectric 24 can be, e.g., silicon carbide (SiC). In another embodiment, the dielectric 24 can be, e.g., silicon carbide nitride (SiCN).

Figure 15:
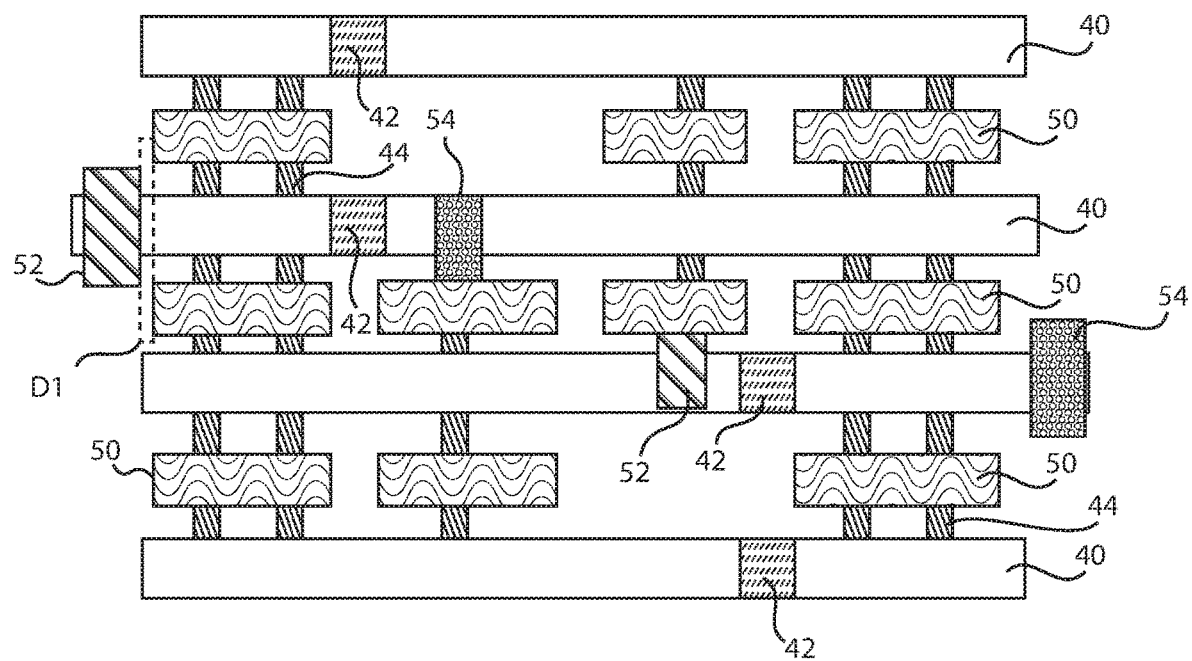
FIG. 15 is a layout view of the SRAM memory of FIG. 14 where CB is formed for gate contacts, in accordance with an embodiment of the present invention.

FIG. 15 is a layout view of the SRAM memory of FIG. 14 where CB is formed for gate contacts, in accordance with an embodiment of the present invention.

The plugs in ohmic contacts (CB) 52 are formed and the CD contacts 54 are also formed. The gate contact patterning can be performed by two optical lithography masks due to tight pitches (which are CB and CD). Also, in another embodiment, gate contact patterning can performed by one mask (e.g., EUV) to obtain a tight pitch.

Additionally, CB to TS can be pushed further than 34 nm. The TS cap layer prevents any CB-to-TS shorts, which is a key feature that improves density scaling.

D1 is the distance between the CB contact 52 and the TS contact filled with dielectric 24. Conventionally, D1 is decided by the insulating film thickness, which is required to meet reliability criteria and patterning/process variability. However, in the exemplary embodiments of the present invention there is a dielectric cap on TS. Therefore, D1 can be suppressed.

Figure 16:
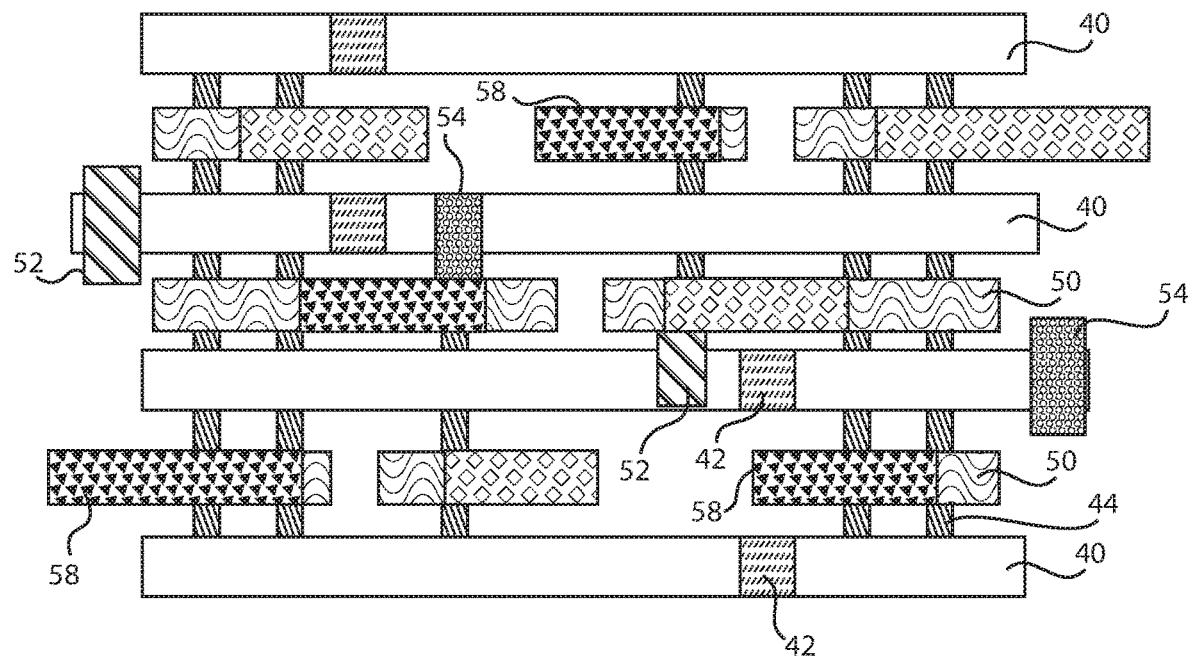
FIG. 16 is a layout view of the SRAM memory of FIG. 15 where CA is formed for TS contacts, in accordance with an embodiment of the present invention.

FIG. 16 is a layout view of the SRAM memory of FIG. 15 where CA is formed for TS contacts, in accordance with an embodiment of the present invention.

The CA contacts 58 are formed and then metallized, and CA etches through the TS cap to connect TS.

Figure 17:
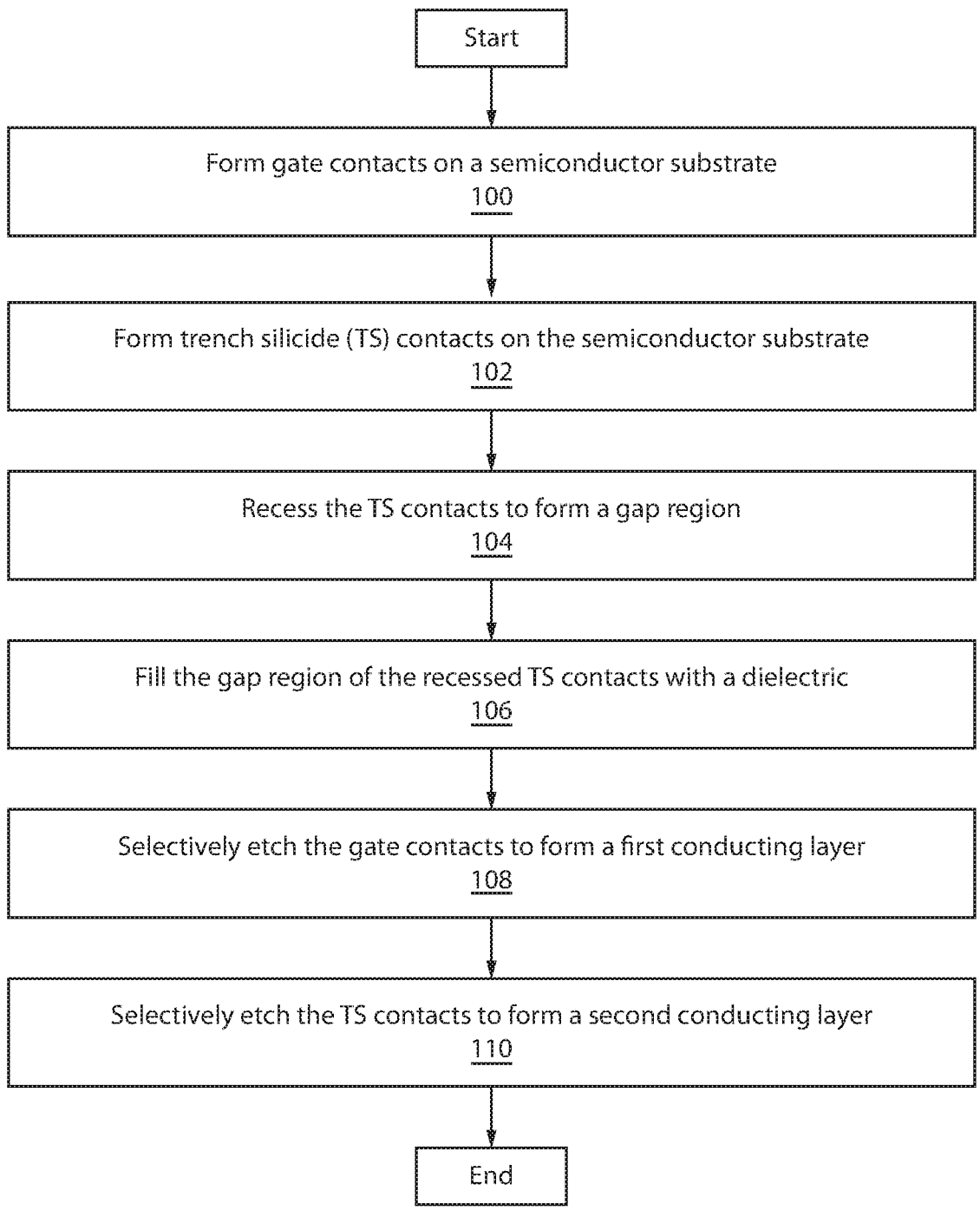
FIG. 17 is a block/flow diagram of an exemplary method for performing static random access memory (SRAM) density scaling, in accordance with an embodiment of the present invention.

FIG. 17 is a block/flow diagram of an exemplary method for forming a semiconductor device, in accordance with an embodiment of the present invention.

At block 100, gate contacts are formed on a semiconductor substrate.

At block 102, trench silicide (TS) contacts are formed on the semiconductor substrate.

At block 104, the TS contacts are recessed to form a gap region.

At block 106, the gap region of the recessed TS contacts is filled with a dielectric.

At block 108, the gate contacts are selectively etched to form a first conducting layer.

At block 110, the TS contacts are selectively etched to form a second conducting layer.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for SRAM density scaling by using middle of line (MOL) flow (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure comprising:
a plurality of gate contacts formed on a semiconductor substrate; and
a plurality of trench silicide (TS) contacts formed on the semiconductor substrate, wherein the plurality of gate contacts and the plurality of TS contacts are disposed in an alternating manner, the plurality of TS contacts recessed to form gap regions thereabove;
wherein only the gap regions of the plurality of the recessed TS contacts are selectively filled with a dielectric, a common first conducting layer is disposed over and directly contacts a portion of each of the plurality of gate contacts, and a second conducting layer having a first portion, a second portion, and a third portion directly contacts a top surface of each of the plurality of TS contacts, the first and second conducting layers being physically separate by the dielectric and distinct from each other, wherein the first, second, and third portions of the second conducting layer are separated from each other by the plurality of gate contacts.

2. The structure of claim 1, wherein the plurality of gate contacts are formed between the plurality of TS contacts.

3. The structure of claim 1, wherein the dielectric is silicon carbide (SiC).

4. The structure of claim 1, wherein the dielectric is silicon carbide nitride (SiCN).

5. The structure of claim 1, wherein the first and second conducting layers are constructed from a same material.

6. The structure of claim 1, wherein the first and second conducting layers are Tungsten (W).

7. The structure of claim 1, wherein the plurality of TS contacts are formed over source/drain regions.

8. A semiconductor structure for performing static random access memory (SRAM) density scaling, the structure comprising:
a plurality of gate contacts and a plurality of trench silicide (TS) contacts formed disposed in an alternating manner over a semiconductor substrate;
gap regions formed after recessing the plurality of TS contacts;
a dielectric for selectively filling only the gap regions of the plurality of recessed TS contacts;
a common first metal layer disposed over and directly contacting the plurality of gate contacts; and
a second metal layer having a first portion, a second portion, and a third portion disposed after the dielectric is recessed and after the first metal layer is formed, the second metal layer contacting a top surface of each of the plurality of TS contacts, and the first and second metal layers being physically separate by the dielectric and distinct from each other, wherein the first, second, and third portions of the second metal layer are separated from each other by the plurality of gate contacts.

9. The structure of claim 8, wherein the plurality of gate contacts are formed between the plurality of TS contacts.

10. The structure of claim 8, wherein the dielectric is silicon carbide (SiC).

11. The structure of claim 8, wherein the dielectric is silicon carbide nitride (SiCN).

12. The structure of claim 8, wherein the first and second metal layers are constructed from a same material.

13. The structure of claim 8, wherein the first and second metal layers are Tungsten (W).

14. The structure of claim 8, wherein the plurality of TS contacts are formed over source/drain regions.

15. The structure of claim 14, wherein the source/drain regions directly contact sidewall spacers disposed adjacent the plurality of gate contacts.

16. The structure of claim 8, further comprising metallizing a portion of the plurality of gate contacts.

17. The structure of claim 16, wherein the metallizing includes depositing tungsten (W).

18. The structure of claim 8, wherein the plurality of gate contacts are formed directly on the semiconductor substrate.

* * * * *